United States Patent [19]
Haskell et al.

[11] Patent Number: 5,116,778
[45] Date of Patent: May 26, 1992

[54] DOPANT SOURCES FOR CMOS DEVICE

[75] Inventors: Jacob D. Haskell, Palo Alto; Steven C. Avanzino, Cupertino; Balaji Swaminathan, Mountain View, all of Calif.

[73] Assignee: Advanced Micro Devices, Inc., Sunnyvale, Calif.

[21] Appl. No.: 474,614

[22] Filed: Feb. 5, 1990

[51] Int. Cl.[5] .................... H01L 21/70; H01L 21/76; H01L 21/331

[52] U.S. Cl. ........................... 437/57; 437/152; 437/164

[58] Field of Search ................. 437/57, 152, 162, 164

[56] References Cited

U.S. PATENT DOCUMENTS

| | | | |
|---|---|---|---|
| 3,608,189 | 9/1971 | Gray | 437/164 |
| 3,615,938 | 10/1971 | Tsai | 437/164 |
| 3,700,507 | 10/1972 | Murray | 437/164 |
| 4,045,259 | 8/1977 | Sanders | 437/56 |
| 4,209,350 | 6/1980 | Ho et al. | 437/67 |
| 4,224,089 | 9/1980 | Nishimoto et al. | 432/56 |
| 4,455,325 | 6/1984 | Razouk | 437/164 |
| 4,477,310 | 10/1984 | Park et al. | 156/643 |
| 4,755,486 | 7/1988 | Treichel et al. | 437/164 |
| 4,782,036 | 11/1988 | Becker et al. | 437/164 |
| 4,818,714 | 4/1989 | Haskell | 437/34 |
| 4,837,179 | 6/1989 | Foster et al. | 437/164 |

FOREIGN PATENT DOCUMENTS 0083785 7/1983 European Pat. Off. .
0259605 8/1987 European Pat. Off. .
8603620 6/1986 World Int. Prop. O. .

Primary Examiner—Robert Kunemund
Assistant Examiner—G. Fourson
Attorney, Agent, or Firm—Benman & Collins

[57] ABSTRACT

A process is provided for doping both sidewalls (26, 28) of isolation trenches (24, 26, 28) and connector regions (46, 48) between sources (58) and gate areas (62) and between drains (60) and gate areas in silicon CMOS devices. Appropriately doped glasses (16, 18, 30) formed on the silicon substrate (14) serve as the source of doping.

48 Claims, 5 Drawing Sheets

DOPANT SOURCES FOR CMOS DEVICE

BACKGROUND OF THE INVENTION

1. Field of the Invention

The present invention relates to silicon device processing, and, more particularly, to controllably doping regions in silicon during the fabrication of CMOS devices.

2. Description of the Related Art

A process for fabricating self-aligned, planarized semiconductor devices is disclosed in applications Ser. Nos. 07/346,248, 07/352,708, and 07/338,496, assigned to the same assignee as the present application. The main feature of the process is the use of etch-stop dielectric layers in the definition and self-alignment of source, gate, and drain regions and interconnects thereto. While the process described therein is useful in the fabrication of semiconductor devices, particularly at sub-micrometer feature sizes, work continues to simplify the process.

In particular, it is desired to form the connector regions between source and gate regions and between drain and gate regions and to ensure isolation between N-channel devices and P-channel devices in CMOS circuits.

A shallow (<0.2 μm), heavily doped junction, especially P+, is extremely difficult to obtain with good junction quality. Such junctions are desired, for example, in the connector regions between gate and source and between gate and drain. It is also necessary to increase the P-type doping along the sidewalls of trenches in the P-well area in order to prevent leakage caused by sidewall inversion. Similarly, it may be necessary to increase the N-type doping along the sidewalls of trenches in the N-well area. Ion implantation, which is commonly used to implant dopants, is difficult to accomplish on a vertical sidewall due to a shadowing (geometrical) effect.

SUMMARY OF THE INVENTION

Accordingly, it is an object of the invention to provide a process for fabricating shallow junctions.

It is also an object of the invention to provide a process for fabricating shallow junctions that are heavily doped and buried under non-doped oxide or nitride.

It is another object of the invention to establish connector regions between source and gate regions and between drain and gate regions.

It is still another object of the invention to establish increased doping of trench sidewalls in P-well and/or N-well areas to prevent sidewall inversion.

In accordance with the invention, a process is provided for fabricating such shallow junctions. As used herein, shallow junctions are defined as having a depth of less than about 0.2 μm. The process may be used to fabricate heavily doped junctions. As used herein, heavy doping refers to a doping level of at least about $10^{17}$ cm$^{-3}$.

The process of the invention is advantageously employed at two separate places in the device. First, it is used to dope the sidewalls of trenches that are used to isolate one transistor from a neighboring transistor on a substrate. This is done by a lateral diffusion of dopant from a dopant source (a plasma-deposited boron- or phosphorus-containing glass deposited on the sidewalls of the trenches). Second, it is used to form the connectors between the source and gate regions and between the drain and gate regions. This is done by a vertical diffusion of dopant from a buried dopant source (a plasma-deposited boron-containing glass (for P-channel devices) or a plasma-deposited phosphorus-containing glass (for N-channel devices) deposited on the silicon substrate above where the connectors are to be formed). Other glasses useful in the practice of the invention in addition to plasma-deposited glasses include atmospheric-doped glass and low pressure chemical vapor deposition (LPCVD) doped-tetra-ethyl ortho silicate (TEOS) glass.

The process comprises in situ doping of portions of a plurality of semiconductor devices having source, gate, and drain regions, with connector regions therebetween, and with isolation trenches having sidewalls between neighboring devices. In particular, the process comprises forming a doped glass layer over the connector regions and along the sidewalls. During subsequent processing, the dopant is driven into the silicon to form the connectors and, for N-channel devices, to prevent trench sidewall inversion (usually boron-doped glass). Similarly, phosphorus-doped glass may be used for the P-channel devices.

Other objects, features and advantages of the present invention will become apparent upon consideration of the following detailed description and accompanying drawings, in which like reference designations represent like features throughout the FIGURES.

BRIEF DESCRIPTION OF THE DRAWINGS

The drawings referred to in this description should be understood as not being drawn to scale except if specifically noted. Moreover, the drawings are intended to illustrate only one portion of an integrated circuit fabricated in accordance with the present invention.

FIGS. 1-11 are cross-sectional views, depicting various stages during the process of the invention of the fabrication of both an N-channel device and a P-channel device on a semiconductor substrate.

FIGS. 5 and 6 are somewhat larger than FIGS. 1-4, in order to illustrate certain details.

FIGS. 7, 8a, 8b and 10 are even larger views of one of the devices, or a portion thereof (the other being shown in phantom).

FIG. 11 depicts an alternate embodiment.

DETAILED DESCRIPTION OF THE INVENTION

Reference is now made in detail to a specific embodiment of the present invention, which illustrates the best mode presently contemplated by the inventors for practicing the invention. Alternative embodiments are also briefly described as applicable.

In the process of the invention, N- and P-wells 10, 12 have already been defined in a silicon wafer 14. The formation of such wells is well-known. The silicon wafer 14 employed is one that has been processed in accordance with well-known prior art processes.

A thin layer 16 of boro-silicate glass (BSG) is deposited on the surface 14a of the wafer. The BSG layer 16 is advantageously deposited by plasma deposition, the parameters of which are within the knowledge of those skilled in this art. The BSG layer is deposited to a thickness of about 100 to 1,000 Å; less than about 100 Å may not provide a continuous layer, while greater than about 1,000 Å may provide problems associated with thick layers, for example, stress. Preferably, the thickness of the BSG layer is about 300 to 500 Å. The BSG layer contains from about 0.5 to 4.5 wt% boron. The factors governing the boron concentration are the total time-temperature budget of the process after deposition and the final concentration and junction depths required on the connectors and sidewalls of the device.

Figure 1:
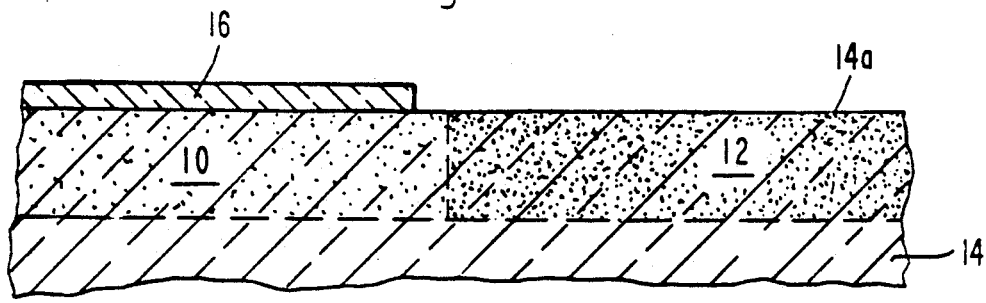

A P-connector mask (not shown) is then applied to the BSG layer 16, to expose those areas of BSG to be removed. BSG is left where the active P-channel areas will be defined and where contacts to the P-well are needed. The unwanted BSG is removed by etching, such as by plasma etching. FIG. 1 depicts a portion of the wafer, showing a region covered by a defined layer 16 of BSG.

The remaining BSG 16 is densified by subjecting the wafer to a temperature of about 700° C. in an atmosphere of nitrogen for about 10 to 30 minutes. Such densification procedure is well-known in the art, and as is also wellknown, the temperature should be kept low enough that no diffusion occurs during this step.

A thin layer 18 of phospho-silicate glass (PSG) is deposited on the surface 14a of the wafer. The PSG layer 18 is advantageously deposited by plasma deposition, the parameters of which are within the knowledge of those skilled in this art. The PSG layer is deposited to a thickness of about 100 to 1,000 Å, and preferably about 300 to 500 Å, and contains from about 2 to 7 wt% phosphorus. The same factors that govern the boron concentration also govern the phosphorus concentration.

Figure 2:
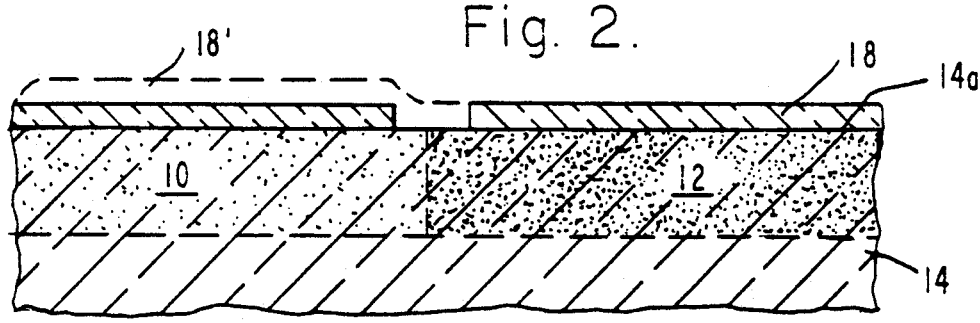

An N-connector mask (not shown) is then applied to the PSG layer 18, to expose those areas of PSG to be removed. PSG is left where the active N-channel areas will be defined and where contacts to the N-well are needed. The unwanted PSG is removed by etching, such as by wet etching, using dilute buffered hydrofluoric acid (BHF). The etching of PSG does not significantly etch the BSG, since highly doped BSG that has been densified etches at a slower rate than the undensified PSG. FIG. 2 depicts a portion of the wafer, showing a region covered by a defined layer 18 of PSG. Those portions removed by etching are shown in phantom, denoted 18'.

The remaining PSG 18 is densified as above.

Next, an isolation mask 22 is applied, to define regions of isolation between devices. The isolation mask comprises a common mask material, such as photoresist.

Figure 3:
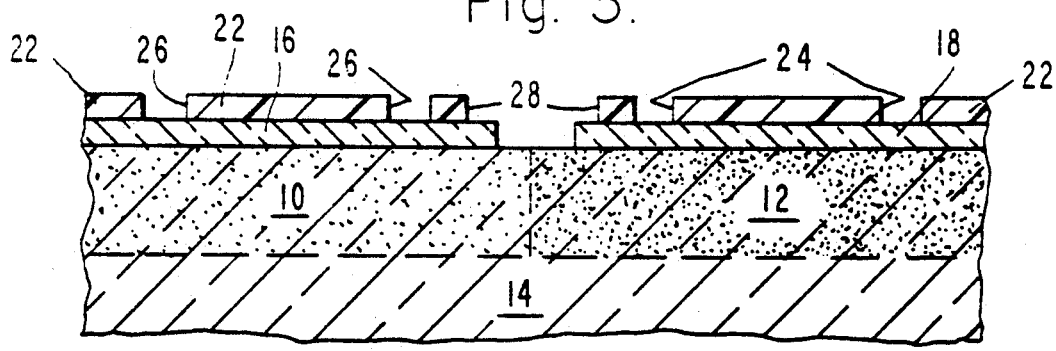

Portions of the mask 22 are photolithographically developed to expose underlying glass (for N-channel isolation and for P-channel isolation) or silicon (for N/P channel separation). Openings 24 define N-channel isolation. Openings 26 define P-channel isolation. Opening 28 defines N/P channel separation. The resulting structure is depicted in FIG. 3.

Figure 4:
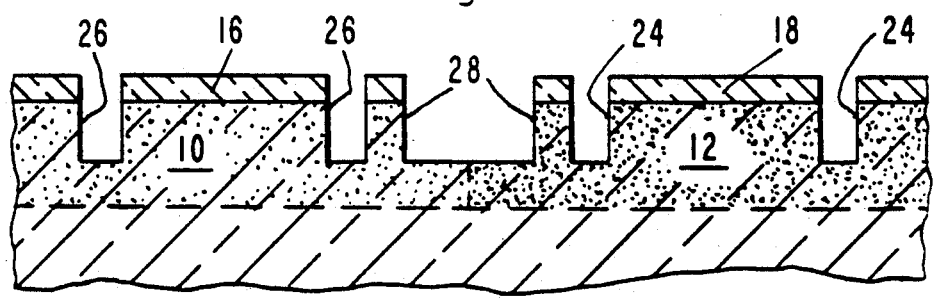

Portions of the underlying glass layers 16, 18 are etched through to expose underlying silicon, in order to extend openings 24, 26, and 28 into the silicon substrate by anisotropically etching the silicon. In this manner, trenches of about 0.4 to 1 μm depth are formed to isolate N-type and P-type devices from each other. There is no particular limit on trench width, other than that which can be fabricated. The resulting structure is depicted in FIG. 4.

Figure 5:
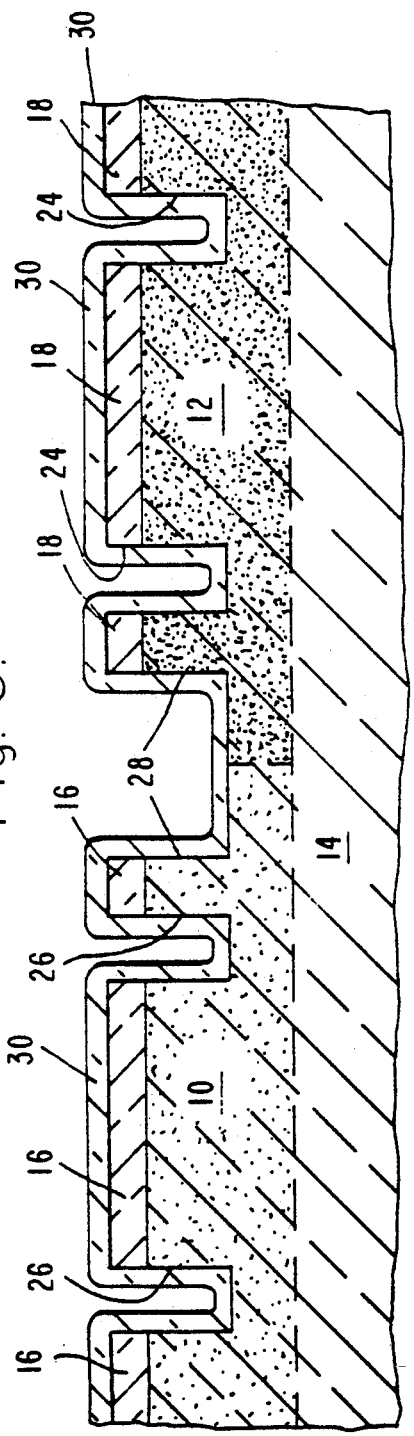

A second BSG layer 30 is deposited everywhere over the wafer. The BSG layer 30 is advantageously deposited by plasma deposition, as above, to a thickness of about 100 to 1,000 Å, and preferably about 500 Å, and contains about 0.5 to 2.5 wt% boron. The purpose of this layer is to increase the P-type doping of the vertical sidewall of the N-channel devices. This prevents inversion of the sidewall. An additional benefit of leaving the oxide in place is for stress relief when the trenches are subsequently filled with TEOS. The factors that govern the boron concentration are the same as those discussed above. The resulting structure is depicted in FIG. 5.

Next, an N-channel field mask (not shown) is applied to the wafer 14. Portions of the second BSG layer 30 are then etched out, such as by wet etching. The portions removed are from the P-channel trench areas and the P-channel surface areas. Once again, a differential etch rate is taken advantage of; the lower doped boron glass etches much faster ($\approx$2:1 in 40:1 BHF) than the higher doped glass. For example PSG (densified) etches at a rate of about 400 Å/min, BSG (3-4 wt%—densified) etches at a rate of about 55 Å/min, and BSG (2-2.5 wt%—not densified) etches at a rate of about 100 Å/min.

It should be noted that the remaining BSG layer 30 is left in place during the complete process. This is possible, since no diffusion into silicon of the doped glasses occurs if the processing temperatures are kept below about 800° C.

If desired, a layer of PSG can be deposited on the P-channel trench areas to dope the sidewalls thereof.

An oxide layer 34, deposited by a low temperature process, such as TEOS, is deposited to a thickness of about 1 to 1.5 μm. The deposition is conveniently carried out at about 700° C. The thickness is governed by the need to keep the lowest oxide height formed during the filling above the level of the silicon surface for large spaces.

Figure 6:
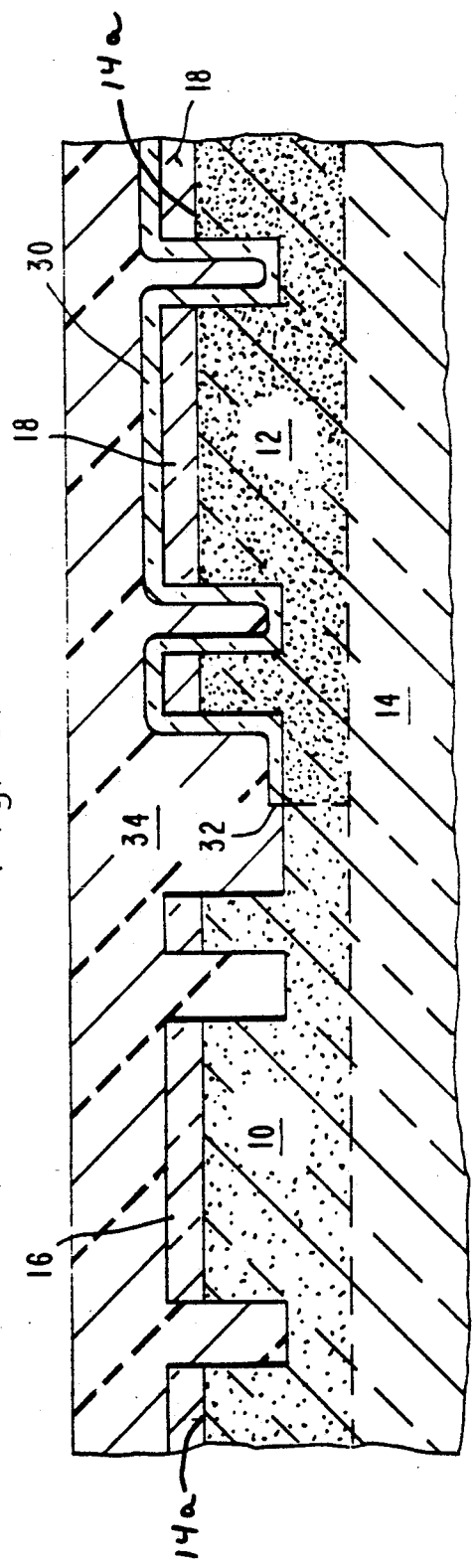

Following deposition, the oxide layer 34 is planarized, employing methods well-known in the art. The structure is shown in FIG. 6. It will be observed that the BSG layer 30 covers only the N-channel device area, providing separation between the N-channel and P-channel devices at point 32 (within alignment tolerances).

An interconnect mask (not shown) is then used to define areas in the oxide layer 34 that are to be etched. The areas define (a) source, gate, and drain openings 36, 38, 40, respectively, to the underlying silicon and (b) connections between transistors, all of which will be filled with conducting material (interconnects). The etching is done through the underlying portions of the glass to the silicon surface 14a using a plasma. The resulting openings have substantially vertical sidewalls.

The presence of the buried BSG and PSG layers 16 and 18 aids in establishing when the silicon surface 14a has been exposed. This may be accomplished by using an "end point" etch detection scheme well-known in the art to identify boron and/or phosphorus signal(s) and then etching for a sufficient time to allow for nonuniformities of the oxide thickness on the wafer or from wafer to wafer in a batch of wafers being processed simultaneously.

Figure 7:
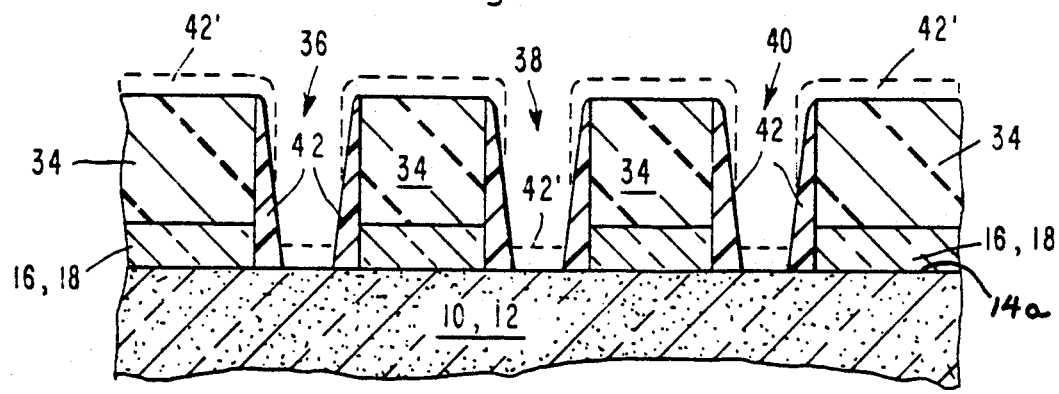

This step is important to the practice of the invention. At this stage of the process, a doped buried glass layer 16, 18 has been provided under undoped (TEOS) oxide 34, as seen in FIG. 7. At this stage in the processing, there has been no diffusion from the doped glass layers 16, 18 into the underlying silicon 14.

Next, a thin TEOS deposition of about 300 to 800 Å is carried out (at about 700° C.) and the oxide is etched back to form oxide spacers 42 as shown in FIG. 7. The lines in phantom, denoted 42', shown the oxide prior to etch.

Figure 8A:
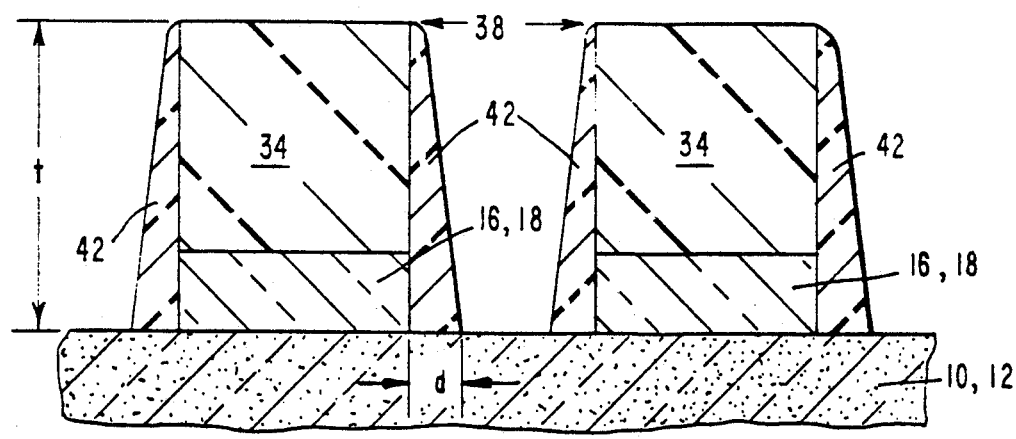

These spacers 42 are required in the gate opening 38 to prevent doping of the gate silicon area during the subsequent gate oxidation step by outgassing from the edges of the doped glass (see FIG. 8a).

Figure 8B:
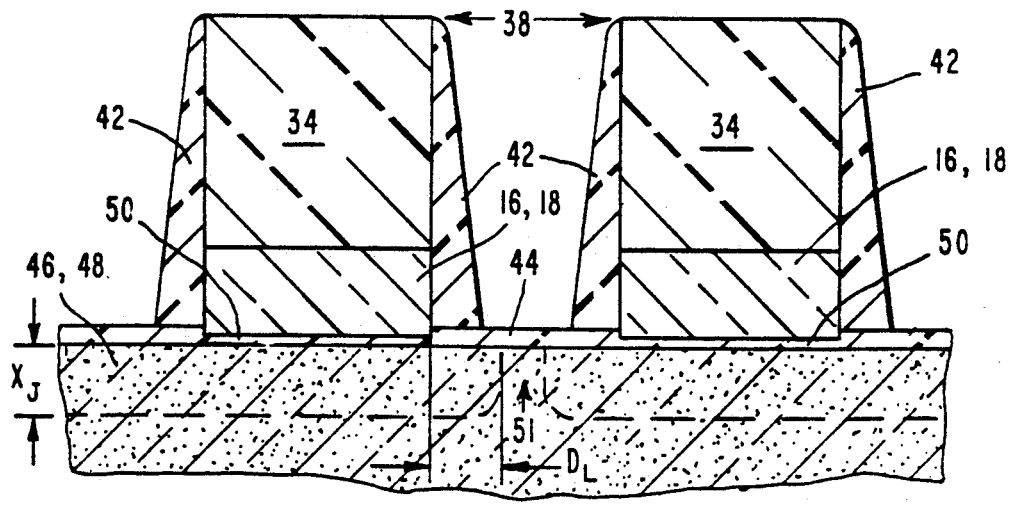

Next, as shown in FIG. 8b, a thin oxide film 44 is grown in the exposed portions of the semiconductor substrate 14. The gate oxide 44, as is conventional, is formed to a thickness between about 50 and 250 Å, depending on the scaling of the device. The oxide is removed from the source and drain openings by using resist (not shown) and a dry or wet etch to etch the gate oxide in the exposed source and drain openings 36 and 40, respectively, while the gate oxide 44 is covered with resist.

It will be appreciated that during the gate oxidation, the dopant outdiffuses from doped glass layers 16, 18 overlying the connector areas 46, 48 (vertical diffusion) and the sidewall glass 30 lining the sidewalls 26, 28 (lateral diffusion) to dope adjacent regions of the silicon 14. This is accomplished by modifying the gate oxidation cycle such that an inert gas drive-in occurs prior to oxidation. Once oxidation takes place, a thin thermal oxide film 50 will grow between the silicon 14 and the doped (glass) oxides 16, 18. This cuts off any further doping from the glasses.

The dopants from the doped glass layers 16, 18, and 30 are driven at a temperature of at least about 800° C., employing a furnace anneal, and typically about 800° to 900° C. for a period of time ranging from about 5 to 90 minutes, depending on the particular junction depth desired. It is easily within the capability of the person skilled in the art to select the desired junction depth and the combination of times and temperatures required to achieve that junction depth. Typically, the higher temperatures are associated with the shorter times. As an example, the out-diffusing may be done at a temperature of about 850° C. for about 30 minutes.

In an alternative embodiment, rapid thermal annealing (RTA) may be used to drive the dopants. The RTA conditions employed are a temperature ranging from about 900° C. to 1,100° C. and a time ranging from about 10 seconds (at the higher temperature) to 2 minutes (at the lower temperature). As an example, RTA may be done at 1,000° C. for about 30 seconds. RTA offers the possibility of forming very shallow junctions.

With the spacers 42 in place, the gate area 51 does not get doped. FIG. 8a depicts an enlargement of the gate opening 38 prior to forming the gate oxide, while FIG. 8b depicts an enlargement of the gate opening after the gate oxidation cycle.

At this stage in the process, the oxide layer 34 may range from about 2,000 to 6,000 Å thick (t), and is preferably about 3,000 to 4,000 Å thick. The widest extent (d) of the TEOS oxide spacer 42 is about 300 to 800 Å. The thickness $X_J$ of the connector region 46, 48 is about 0.1 to 0.2 $\mu$m and lateral diffusion $D_L$ of the connector area is about $0.8 \times X_J$.

Figure 9:
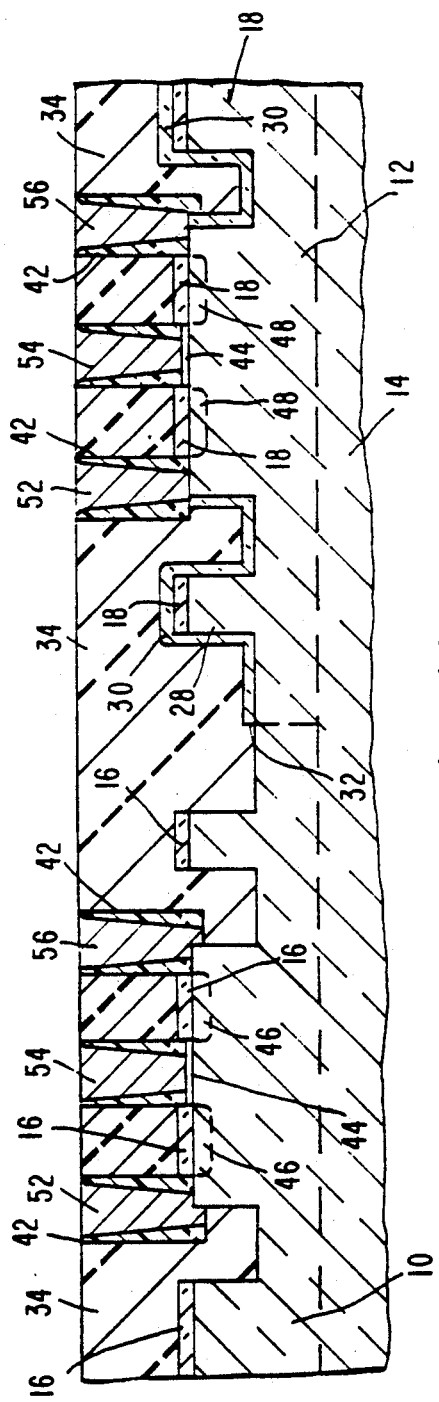

A polysilicon layer (not shown) is blanket-deposited to a thickness of about 60 to 80% of the largest feature width. For example, where the largest feature width is 1 $\mu$m, then the polysilicon layer is about 7,000 Å. The polysilicon layer is then etched or polished (chemical/mechanical) back to stop on the oxide layer 34. The polysilicon fills all the source 36, gate 38, and drain 40 openings to form plugs 52, 54, 56, respectively, therein. The structure is depicted in FIG. 9. It will be noted that buried glass layers 16, 18 remain in the connector areas, and that the buried glass layer 30 remains in the trenches of the N-channel devices.

An advantage of the foregoing process is provided by comparison to conventional silicon processes in which the polysilicon is defined first after forming the gate oxide. The connectors are then formed by ion implantation. Finally, the oxide is formed and planarized. However, the topography is very difficult to make flat, and as spaces become smaller, it becomes difficult to do without causing buried voids in the oxide.

Regions of the remaining polysilicon are now doped P+ and N+ by ion implantation and suitable masking. Boron ions are implanted to give P+ doping into the polysilicon plugs 52, 54, 56 over P-channel sources, gates, and drains. Phosphorus ions are implanted to give N+ doping into polysilicon plugs 52, 54, 56 over N-channel sources, gates and drains. Additionally, masking permits undoped polysilicon regions to be defined.

Ion implantation permits doping the undoped P-channel gate poly 54 lower than the source and drain polys 52 and 56, using a light blanket boron implant. This is an advantage, since it is well-documented in the prior art that a heavily doped boron poly over a thin gate oxide ($\leq 150$ Å) can degrade the quality of the oxide. With suitable masking, the N-channel gate doping may also be reduced in like fashion.

Following ion implantation, the dopants are driven at a temperature (typically about 800° to 900° C.) and for a time (typically about 15 to 180 minutes) sufficient to diffuse the dopant through the poly plugs to form a junction at a suitable depth in the silicon 14. As an example, the dopants may be driven at 900° C. for 30 minutes in an inert atmosphere, such as nitrogen or argon for a poly thickness of about 3,000 to 4,000 Å. This further drives the connector junctions 46, 48.

The transistor is now complete, except for silicidation of the polysilicon. The foregoing process is much simpler than prior art steps that need substantial complexity to achieve the same degree of planarity.

Figure 10:
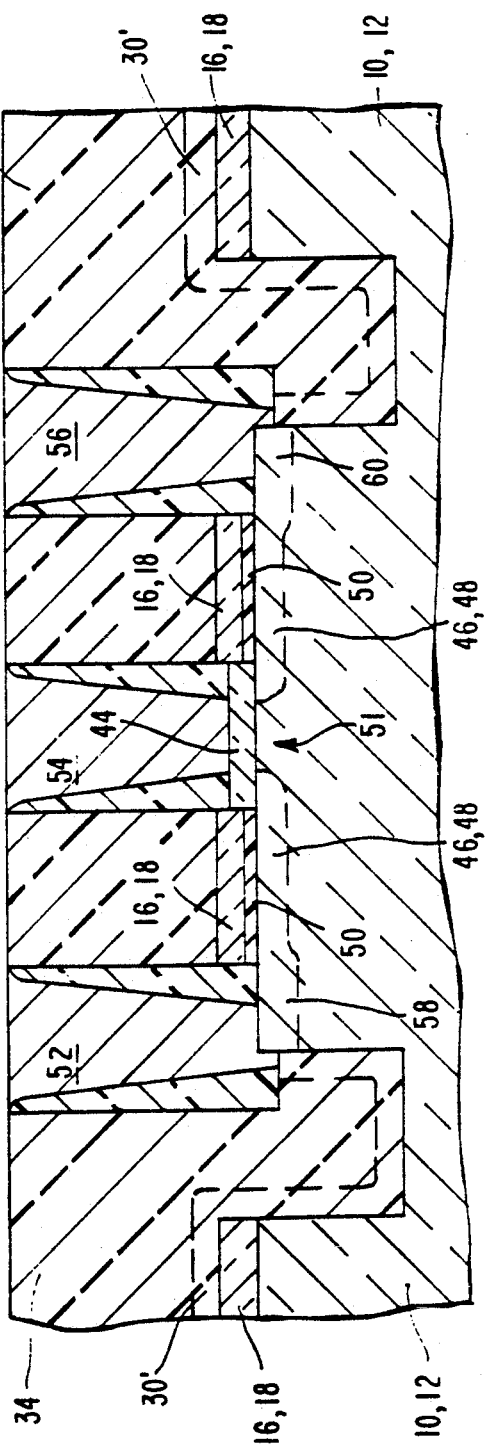

FIG. 10 depicts a P-channel device (the corresponding N-channel device is indicated with reference numerals in parenthesis and with layer 30 shown in phantom as 30'). Following the dopant drive from the polysilicon plugs, source regions 58 and drain regions 60 are formed. These are connected to the device channel area 51 by means of connectors 46, 48.

The following advantages of the process of the invention are noted:

Doped glasses are used for connectors and trench dopant sources, rather than ion implantation.

No doping of silicon occurs until a processing temperature of more than 800° C. is reached.

The process is kept below 800° C. prior to formation of the gate oxide.

The gate oxide process dopes the connector areas by using a $N_2$/Ar drive prior to oxidation. Oxidation grows a thermal oxide which at the interface cuts off further dopant diffusion from the glasses into silicon.

Note that a further advantage of having the doped glass in the trenches is as a stress relief between the TEOS oxide and silicon. This stress results in a positive charge that can invert the sidewalls. (In an N-channel sidewall the positive charge turns off the P-channel leakage.) It is possible to also perform a similar process for the P-channel sidewalls using a PSG layer (not shown) and a P-channel field mask as done with the N-channel field mask, as mentioned above.

Figure 11:
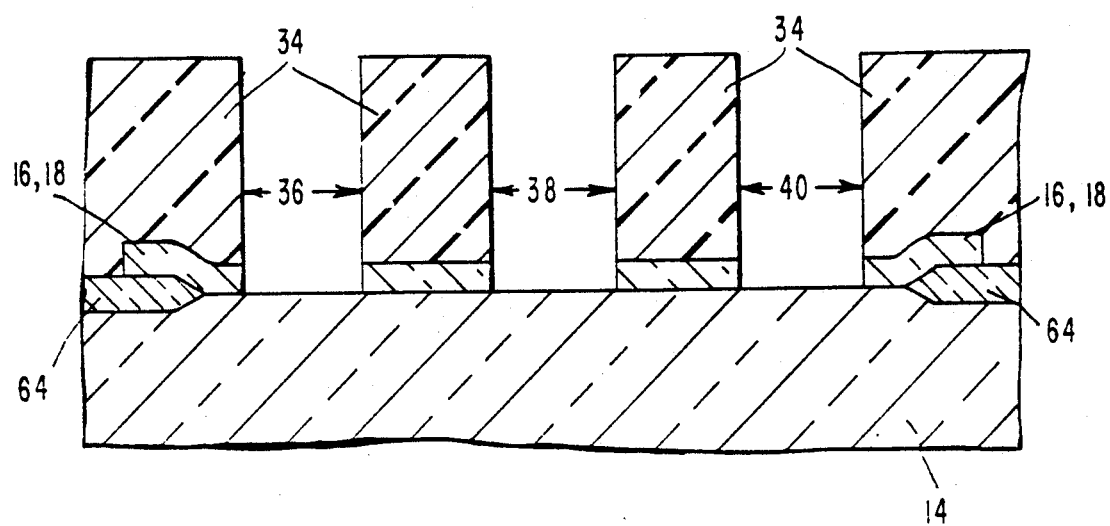

The doped glass in the trenches may be eliminated, particularly where other isolation schemes, such as LOCOS, SWAMI, ROX, etc. are employed. In such an approach, the transistors are fabricated using doped glass as described above to dope the connector regions, but eliminating the sidewall deposition. Such doped glass for the connector regions would be deposited after a conventional isolation is in place. FIG. 11 depicts an example of an FET structure employing the doped glass layer 16 for doping the connector regions. As above, separate glass layers 16 and 18 would be used to dope connector regions in P-channel (boron) and N-channel (phosphorus) devices, respectively. The structure depicted is just after forming the source, gate, and drain openings 36, 38, 40 in the oxide 34. Isolation is provided by field oxide 64. Processing then proceeds as above to form the gate oxides, dope the connectors, form the source and drains and the contacts thereto, and otherwise complete the device.

The foregoing description of the preferred embodiment of the present invention has been presented for purposes of illustration and description. It is not intended to be exhaustive or to limit the invention to the precise form disclosed. Obviously, many modifications and variations will be apparent to practitioners skilled in this art. It is possible that the invention may be practice in other MOS, bipolar, photoelectronic, microwave or photoacoustical fabrication technologies. Similarly, any process steps described might be interchangeable with other steps in order to achieve the same result. The embodiment was chosen and described in order to best explain the principles of the invention and its practical application, thereby enabling others skilled in the art to understand the invention for various embodiments and with various modifications as are suited to the particular use contemplated. It is intended that the scope of the invention be defined by the claims appended hereto and their equivalents.

What is claimed is:

1. A process for in situ doping of portions of a plurality of semiconductor devices having source, gate, and drain regions and electrically conducting contacts thereto, with connector regions therebetween, and with isolation trenches having sidewalls between neighboring devices formed in a semiconductor substrate, said process comprising:
   (a) forming a doped glass layer over at least said connector regions and along said sidewalls and subsequently, just prior to forming a gate oxide over said gate region;
   (b) outdiffusing dopant from said doped glass layer and into said connector regions and said sidewalls; and
   (c) separately forming said source and drain regions by outdiffusion from doped polysilicon plugs formed thereover.

2. The process of claim 1 wherein said plurality of semiconductor devices includes both N-channel devices and P-channel devices, formed on one silicon substrate.

3. The process of claim 2 wherein a first boron-containing glass formed on the surface of said silicon above said connector regions of said P-channel devices is used to dope said connector regions.

4. The process of claim 3 wherein said first boron-containing glass contains about 0.5 to 4.5 wt% boron and is formed to a thickness of about 100 to 1,000 Å.

5. The process of claim 4 wherein said thickness ranges from about 300 to 500 Å.

6. The process of claim 2 wherein a phosphorus-containing glass formed on the surface of said silicon above said connector regions of said N-channel devices is used to dope said connector regions.

7. The process of claim 6 wherein said phosphorus-containing glass contains about 2 to 7 wt% phosphorus and is formed to a thickness of about 100 to 1,000 Å.

8. The process of claim 7 wherein said thickness ranges from about 300 to 500 Å.

9. The process of claim 2 wherein a second boron-containing glass is formed on the surface of said silicon in trenches isolating said N-channel devices to prevent the trench sidewalls from inverting.

10. The process of claim 9 wherein said second boron-containing glass contains about 0.5 to 2.5 wt% boron and is formed to a thickness of about 100 to 1,000 Å.

11. The process of claim 10 wherein said thickness is about 500 Å.

12. The process of claim 2 wherein a second phosphorus-containing glass is formed on the surface of said silicon in trenches isolating said P-channel devices to prevent the trench sidewalls from inverting.

13. The process of claim 12 wherein said second phosphorus-containing glass contains about 3 to 7 wt% and is formed to a thickness of about 100 to 1,000 Å.

14. The process of claim 13 wherein said thickness is about 500 Å.

15. The process of claim 11 wherein said outdiffusing is done at about 800° to 1,000° C. for a period of time ranging from about 10 seconds to 90 minutes.

16. The process of claim 1 wherein prior to said outdiffusing, (a) an oxide layer is formed over said doped glass layer at a temperature less than about 800° C., (b) source, gate, and drain openings are formed through said oxide layer and through said underlying doped glass layer to expose said semiconductor, and (c) an oxide spacer film is formed on the walls of said gate opening, said oxide spacer film formed to a thickness ranging from about 300 to 800 Å.

17. The process of claim 16 wherein said oxide spacer film is formed from tetra-ethyl orthosilicate.

18. A process for in situ doping of portions of a plurality of semiconductor devices having source, gate, and drain regions, with connector regions therebetween, and with isolation trenches having sidewalls between neighboring devices formed in a semiconductor substrate, said process comprising (a) forming a doped glass layer over said connector regions, (b) forming an oxide layer over said doped glass layer at a temperature less than about 800° C., forming source, gate, and drain openings through said oxide layer and through said underlying doped glass layer to expose said semiconductor, (d) forming an oxide spacer film on the walls of said gate opening, said oxide spacer film formed to a thickness ranging from about 300 to 800 Å, (e) forming a gate oxide over said gate region, and (f) out-diffusing dopant from said doped glass layer and into said connector regions.

19. The process of claim 18 wherein said plurality of semiconductor devices includes both N-channel devices and P-channel devices, formed on one silicon substrate.

20. The process of claim 19 wherein a first boron-containing glass formed on the surface of said silicon above said connector regions of said P-channel devices is used to dope said connector regions.

21. The process of claim 20 wherein said first boron-containing glass contains about 0.5 to 4.5 wt% boron and is formed to a thickness of about 100 to 1,000 Å.

22. The process of claim 21 wherein said thickness ranges from about 300 to 500 Å.

23. The process of claim 19 wherein a phosphorus-containing glass formed on the surface of said silicon above said connector regions of said N-channel devices is used to dope said connector regions.

24. The process of claim 23 wherein said phosphorus-containing glass contains about 2 to 7 wt% phosphorus and is formed to a thickness of about 100 to 1,000 Å.

25. The process of claim 24 wherein said thickness ranges from about 300 to 500 Å.

26. The process of claim 18 wherein said outdiffusing is done at about 800° to 1,100° C. for a period of time ranging from about 10 seconds to 90 minutes.

27. The process of claim 18 wherein said oxide spacer film is formed from tetra-ethyl orthosilicate.

28. A process for in situ doping of portions of a semiconductor device having source, gate, and drain regions, with connector regions therebetween, said source, gate, and drain regions located in either an N-well or a P-well in a silicon wafer, said wafer further provided with isolation trenches having sidewalls between neighboring devices, said process comprising:

(a) depositing a first layer or a boron-containing glass on said substrate;

(b) masking portions of said first layer of boron-containing glass and removing those portions not so masked to leave said masked portions defining P-channel areas;

(c) densifying said first layer of boron-containing glass;

(d) depositing a second layer of a phosphorus-containing glass on said substrate;

(e) masking portions of said second layer of phosphorus-containing glass and removing those portions not so masked to leave said masked portions defining N-channel areas;

(f) densifying said second layer of phosphorus-containing glass;

(g) forming isolation trenches in said silicon substrate to (1) define P-channel and N-channel device regions, and (2) to isolate N-channel devices from P-channel devices;

(h) forming a first layer of oxide on said silicon substrate and planarizing said oxide;

(i) etching through said first layer of oxide to form source, gate, and grain openings and interconnect openings;

(j) forming a gate oxide on said silicon surface in said gate opening;

(k) filling said source, drain, and gate openings with polysilicon to form source, gate, and drain plugs, filling said interconnect openings with a conductive material to form interconnect plugs, and doping said polysilicon plugs with an appropriate dopant; and (l) driving said dopants in said polysilicon to form said sources and drains in said silicon substrate and to simultaneously dope said silicon associated with said connector areas from said glass thereabove.

29. The process of claim 28, said process additionally comprising, following step (g), (g1) depositing a third layer of a boron-containing glass, including along the bottoms and sidewalls of said trenches; and (g2) removing those portions of said third layer of boron-containing glass trenches used to isolate P-channel devices within the N-well, such that in step (1), said silicon defining said sidewalls of said trench used to isolate N-channel devices within the P-wall is also doped.

30. The process of claim 29 wherein said third layer of boron-containing glass contains about 0.5 to 2.5 wt% boron and is formed to a thickness of about 100 to 1,000 Å.

31. The process of claim 30 wherein said thickness is about 500 Å.

32. The process of claim 29 additionally comprising, following step (g2), (g3) depositing a fourth layer of a phosphorus-containing glass, including along the bottoms and sidewalls of said trenches; and (g4) removing those portions of said fourth layer of phosphorus-containing glass from N-channel trench areas and N-channel surface areas, such that in step (1), said silicon defining said P-channel trench sidewalls is also doped.

33. The process of claim 32 wherein said fourth layer of phosphorus-containing glass contains about 3 to 7 wt% phosphorus and is formed to a thickness of about 100 to 1,000 Å.

34. The process of claim 33 wherein said thickness is about 500 Å.

35. The process of claim 28 wherein said first layer of boron-containing glass contains about 0.5 to 4.5 wt% boron and is formed to a thickness of about 100 to 1,000 Å.

36. The process of claim 35 wherein said thickness ranges from about 300 to 500 Å.

37. The process of claim 28 wherein said first layer of boron-containing glass and said second layer of phosphorus-containing glass are separately densified by heating to a temperature ranging from about 700° to 800° C. in an inert atmosphere for about 10 to 30 minutes.

38. The process of claim 28 wherein said second layer of phosphorus-containing glass contains about 2 to 7 wt% phosphorus and is formed to a thickness of about 100 to 1,000 Å.

39. The process of claim 38 wherein said thickness ranges from about 300 to 500 Å.

40. The process of claim 28 wherein said dopants are driven at a temperature of about 800° to 1,100° C. in an inert atmosphere for about 10 seconds to 90 minutes.

41. The process of claim 28 additionally comprising, prior to step (j), forming an oxide spacer film on the walls of said gate opening, said oxide spacer film formed to a thickness ranging from about 300 to 800 Å.

42. The process of claim 28 wherein said first oxide is formed from tetra-ethyl orthosilicate, formed to a thickness of about 1 to 1.5 μm.

43. The process of claim 41 wherein said oxide spacer film is formed from tetra-ethyl orthosilicate.

44. In an improved process for in situ doping of portions of a semiconductor device having source, gate, and drain regions, with connector regions therebetween, said source, gate, and drain regions located in either an N-well or a P-well in a silicon wafer, said wafer further provided with isolation trenches having sidewalls between neighboring devices, said process comprising simultaneously doping said connector regions and said sidewalls by:

(a) depositing a first layer of a boron-containing glass on said substrate and patterning said first layer to leave portions thereof defining P-channel areas;

(b) depositing a second layer of a phosphorus-containing glass on said substrate and patterning said second layer to leave portions thereof defining N-channel areas;

(c) forming isolation trenches in said silicon substrate to (1) define P-channel and N-channel devices regions, (2) to isolate N-channel devices from P-channel devices, and (3) to isolate N-channel devices from other N-channel devices and P-channel devices from other P-channel devices;

(d) depositing a third layer of a first dopant-containing glass along the bottoms and sidewalls of said trenches and patterning said third layer to leave portions thereof in first channel sidewalls;

(e) forming a first layer of oxide on said substrate and patterning said first layer for form source, gate, and drain openings and interconnect openings;

(f) forming an oxide spacer film to a thickness ranging from about 300 to 800 Å on the walls of said gate openings;

(g) forming a gate oxide on said silicon surface in said gate openings and removing oxide covering source and drain regions; and (h) driving said dopants to simultaneously dope said connector regions and said trench sidewalls.

45. The process of claim 44 further including, following step (d), depositing a fourth layer of a second dopant-containing glass along the bottoms and sidewalls of said trenches and patterning said fourth layer to leave portions thereof in second channel sidewalls.

46. The process of claim 45 wherein said first dopant-containing glass is a boron-containing glass and wherein said second dopant-containing glass is a phosphorus-containing glass.

47. The process of claim 45 wherein said first channel sidewalls and N-channel sidewalls and wherein said second channel sidewalls are P-channel sidewalls.

48. The process of claim 45 further including filling said openings with polysilicon to form source, gate, and drain plugs and independently doping said polysilicon plugs with an appropriate dopant.

* * * * *